United States Patent
Olenick et al.

(10) Patent No.: US 7,281,412 B2
(45) Date of Patent: Oct. 16, 2007

(54) IN-SITU SEAL INTEGRITY MONITORING

(76) Inventors: John A. Olenick, 202 Portside, Buffalo, NY (US) 14202; Timothy J. Curry, 112 Harding Rd., Buffalo, NY (US) 14220; Robert A. Bourdelaise, 1113 Autumn Gold Dr., Gambrills, MD (US) 21054; Eli A. Richards, 80 N. Prospect Ave., Catonsville, MD (US) 21228; Paul A. Vichot, 5959 Cecil Way, Eldersburg, MD (US) 21784; Barry E. Grabow, 8421 Early Bud Way, Laurel, MD (US) 20723; Samuel F. Wilderson, 8411 Montpelier Dr., Simpsonville, MD (US) 21150

( * ) Notice: Subject to any disclaimer, the term of this patent is extended or adjusted under 35 U.S.C. 154(b) by 66 days.

(21) Appl. No.: 11/222,507

(22) Filed: Sep. 8, 2005

(65) Prior Publication Data

US 2007/0051193 A1 Mar. 8, 2007

(51) Int. Cl.
*G01M 3/00* (2006.01)
(52) U.S. Cl. .......................... 73/52; 73/866
(58) Field of Classification Search .................. 73/866, 73/52
See application file for complete search history.

(56) References Cited

U.S. PATENT DOCUMENTS 5,540,448 A * 7/1996 Heinzen .................. 277/321
5,785,323 A * 7/1998 Heinzen .................. 277/582
6,002,501 A * 12/1999 Smith et al. .................. 398/9
6,003,872 A * 12/1999 Nord .......................... 277/317

(Continued)

FOREIGN PATENT DOCUMENTS

EP 1063212 A1 12/2000

(Continued)

OTHER PUBLICATIONS

S. Yarlagadda et al., "An Automated Technique for Measuring Crack Propagatin during Mode I DCB Testing," Society of Experimental Mechanics, X International Congress, Jun. 4, 2004, 8 pages.

(Continued)

*Primary Examiner*—Hezron Williams
*Assistant Examiner*—Rodney Frank
(74) *Attorney, Agent, or Firm*—Walter W. Duft

(57) ABSTRACT

A high-temperature seal having in-situ integrity monitoring capability includes a quantity of dielectric material sealing an interface between adjacent structures and an electrical transmission line embedded within the dielectric material. A signal injection port is provided for exciting the transmission line with an excitation signal. One or more sample ports are provided for sampling the transmission line to obtain signal samples resulting from the excitation signal. The sample port(s) are adapted for connection to a signal analyzer adapted to analyze the signal samples for indications of seal integrity problems. Using a technique such as time domain reflectometry or frequency response analysis, the transmission line can be monitored for changes in characteristic impedance due to changes in seal dielectric constant and/or disruption of the transmission line. Such evaluation provides useful information for making determinations about seal integrity in a manner that permits safe seal operation and minimization of resultant stress modes.

20 Claims, 15 Drawing Sheets

U.S. PATENT DOCUMENTS

| | | | |
|---|---|---|---|
| 6,614,238 B1 * | 9/2003 | Jean et al. | 324/639 |
| 6,642,807 B1 * | 11/2003 | Gard | 333/24 R |
| 7,152,375 B1 * | 12/2006 | Mastro et al. | 49/507 |
| 2004/0091758 A1 | 5/2004 | Kuriyama et al. | 429/22 |

FOREIGN PATENT DOCUMENTS

| | | |
|---|---|---|
| EP | 1111703 A2 | 6/2001 |
| WO | WO91/08996 | 6/1991 |
| WO | WO02/16278 | 2/2002 |

OTHER PUBLICATIONS

D. Smolyansky, "TDR Helps Isolate Electronic Package Faults," CommsDesign, Sep. 15, 2004, 8 pages.

* cited by examiner

IN-SITU SEAL INTEGRITY MONITORING

BACKGROUND OF THE INVENTION

1. Field of the Invention

The present invention relates to high-temperature seals and their characteristics. More particularly, the invention concerns a technique for in-sit-up monitoring of seal integrity.

2. Description of Prior Art

By way of background, various high-temperature device applications, such as solid oxide fuel cells, involve structures composed of multiple ceramic layers, or interleaved layers of ceramic and metal. To eliminate the possibility of gases (such as fuel constituents) prematurely mixing or leaking from interior regions of the structure, the ceramic-to-ceramic or ceramic-to-metal interfaces of adjacent layer pairs are typically joined and sealed together with a glass or ceramic seal. These seals must be capable of withstanding the high-temperature operating environment of the device over its operational lifetime. The seal materials must also be carefully matched with the adjacent layers in order to minimize, to the extent possible, differences in thermal expansion coefficients, thermal shock resistance, fracture toughness, and mechanical strength characteristics. Failure to do so can lead to the development of severe thermal stresses and consequent seal failure during various device operational modes.

Unfortunately, it is very difficult to monitor seal integrity once a high-temperature device has been fabricated. Is likewise very difficult to determine the cause of a seal failure when such failure occurs. Quite often, the failure is so catastrophic that it destroys the ability to evaluate the reason for the failure. Similarly, any attempt to disassemble the failed device may destroy the evidence required for failure evaluation. As a consequence, the conventional approach used when designing and manufacturing seals for high-temperature applications is to develop mathematical models for calculating the seal stresses that are likely to arise during device operation, and thereby attempt to predict operational regions of safety or failure.

It is to improvements in seal integrity monitoring that the present invention is directed. In particular, the invention addresses the need for an in-sit-up evaluation technique whereby the integrity of high-temperature seals can be monitored during device fabrication and also thereafter during field operation.

SUMMARY OF THE INVENTION

The foregoing is achieved and an advance in the art is provided in a high-temperature seal having in-sit-up integrity monitoring capability, and a related seal monitoring method. The seal includes a quantity of dielectric material sealing an interface between adjacent structures and an electrical transmission line embedded within the dielectric material. A signal injection port is provided for exciting the transmission line with an excitation signal. A pair of sample ports (one of which can also be the signal injection port) are provided for sampling the transmission line to obtain signal samples resulting from the excitation signal. The sample ports are adapted for connection to a signal analyzer adapted to analyze the signal samples for indications of seal integrity problems. Using a technique such as time domain reflectometry or frequency response analysis, the transmission line can be monitored for changes in characteristic impedance due to changes in seal dielectric constant and/or disruption of the transmission line. Such evaluation provides useful information for making determinations about seal integrity in a manner that permits safe seal operation and minimization of resultant stress modes.

BRIEF DESCRIPTION OF THE DRAWINGS

The foregoing and other features and advantages of the invention will be apparent from the following more particular description of exemplary embodiments of the invention, as illustrated in the accompanying Drawings in which.

DETAILED DESCRIPTION OF EXEMPLARY EMBODIMENTS

As summarized above, the present invention facilitates monitoring of the integrity of high-temperature seals constructed from dielectric materials, including glass, ceramic, plastic, etc. By embedding a transmission line within the seal and utilizing transmission line measurement techniques such as time domain reflectometry and/or frequency response analysis, anomalies such as seal dielectric constant variations and/or transmission line disruptions can be detected. Such evaluation provides useful information for making determinations about seal integrity in a manner that permits safe seal operation and minimization of resultant stress modes.

Figure 1:
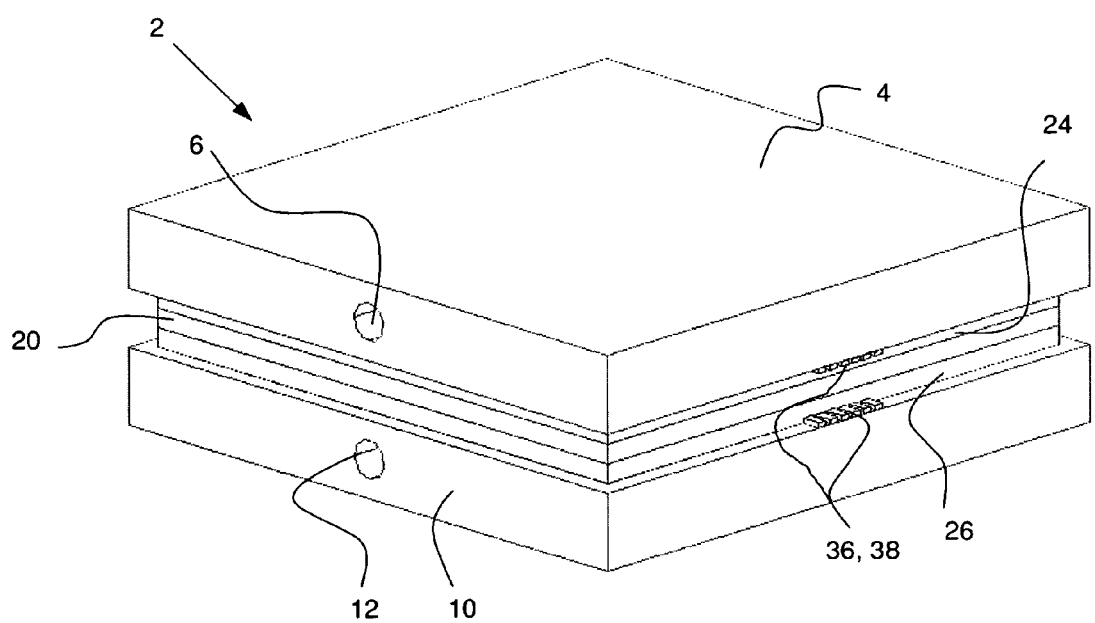
FIG. 1 is a perspective view showing an exemplary solid oxide fuel cell comprising a seal with in-sit-up monitoring capability according to the invention.
Figure 1A:
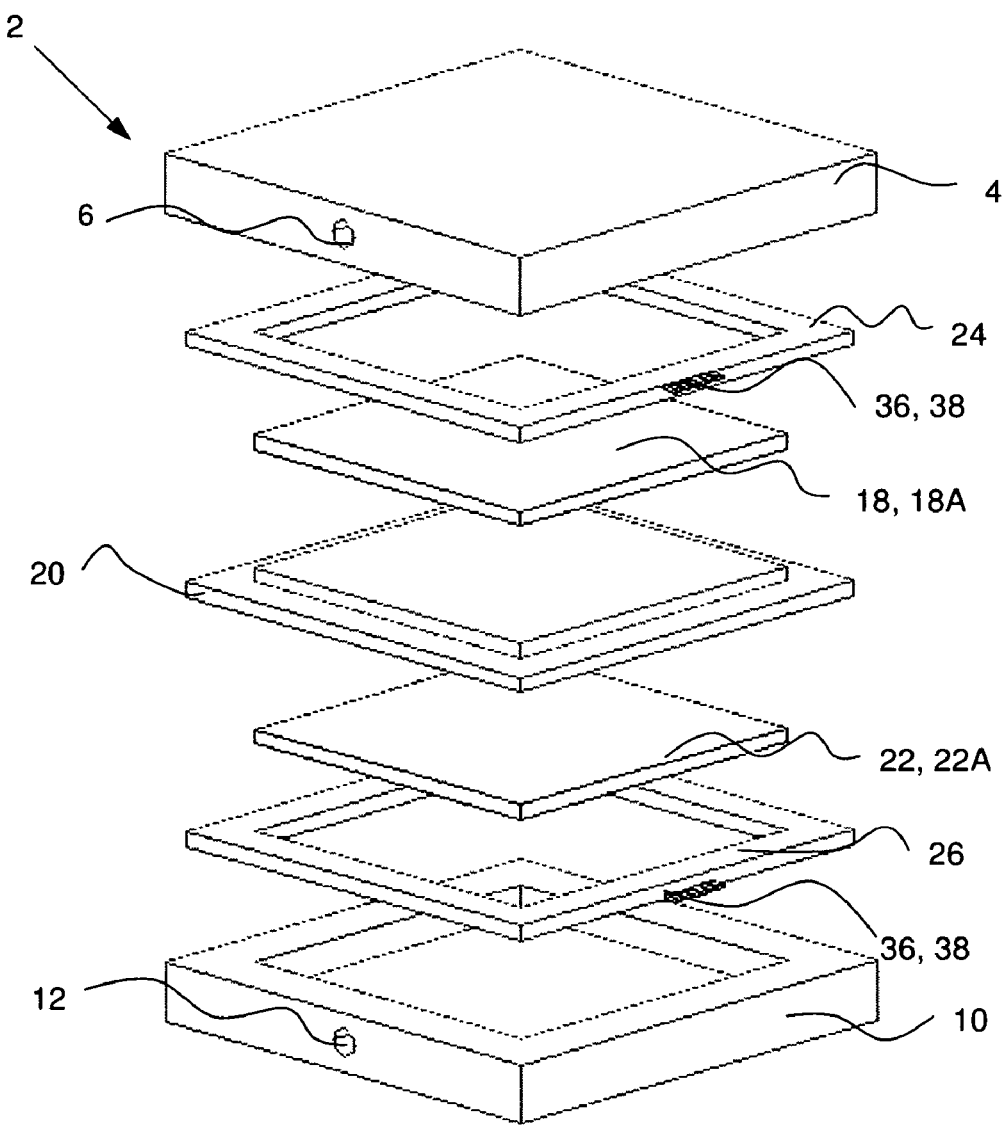
FIG. 1A is an exploded perspective view of the fuel cell of FIG. 1.
Figure 2:
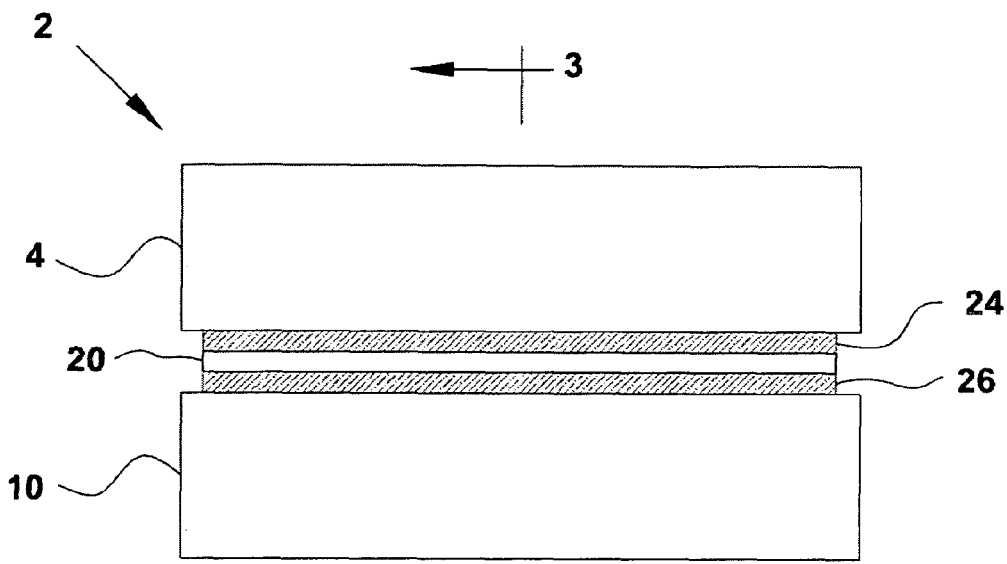
FIG. 2 is a side elevational view of the fuel cell of FIG. 1.
Figure 3:
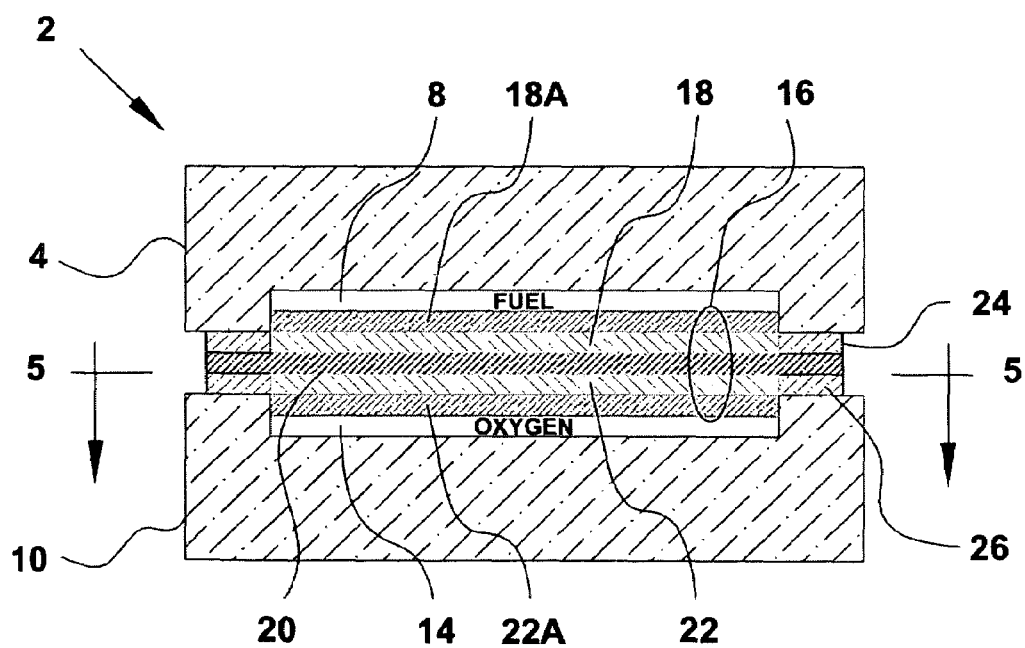
FIG. 3 is a cross-sectional view taken along line 3-3 in FIG. 2.

Although the invention can be used in many different high-temperature seal environments, the invention is particularly useful in applications that utilize glass or ceramic seals. One such application is the solid oxide fuel cell, and FIGS. 1-3 show an exemplary (and greatly simplified) construction of such a device. In particular, FIGS. 1-3 (which are not necessarily to scale) illustrate a single stage fuel cell 2 that comprises a first ceramic plate 4 having a fuel flow port 6 leading to a fuel plenum 8 (FIG. 3), and a second ceramic plate 10 having an oxygen flow port 12 leading to an oxygen plenum 14 (FIG. 3). Disposed between the plates 4 and 10 is a cell stack 16 that includes a first current collector 18A, an anode 18, a solid ceramic electrolyte 20, a cathode 22, and a second current collector 22A. Although not shown, the fuel cell 2 further includes electrical terminals for making electrical connections to the current collectors 18A and 22A.

In order to bond together the components of the fuel cell 2, and also prevent outgassing from the fuel and oxygen plenums 8 and 14, a pair of seals 24 and 26 are respectively disposed between the plates 4 and 10 and the cell stack 16. As described in more detail below, the seals 24 and 26 can be from a suitable glass or ceramic dielectric material that is applied to the desired location using a thick-film technique and fired at high temperature to flow the material. Each seal has a thickness dimension (the vertical direction in FIGS. 2 and 3) that is relatively small in comparison to its width dimension (the horizontal direction in FIG. 2). The width dimension is in turn relatively small in comparison to the seal's length dimension, which extends around the four sides of the fuel cell 2 (one side being shown in FIG. 2).

As will now be described with reference to FIGS. 4A-7C, the seals 24 and 26 are additionally constructed so as to have embedded transmission lines therein. In each of these drawing figures (which are not necessarily to scale), the figure numbers are augmented with the letters "A," "B" and "C" to signify three different seal constructions that are respectively based on the use of three alternative transmission line configurations. Each of the alternative transmission line configurations illustrated in FIGS. 4A-7C, which are shown by way of example only and not by way of limitation, utilizes a signal carrying conductor and at least one, and in some cases two, ground reference conductors. All such conductors comprise an electrically conductive material that preferably matches, as closely as possible, the thermal expansion coefficient of the dielectric material used to form the seals 24 and 26. By way of example only, if the seals 24 and 26 are made from a material such as devitrified glass, the transmission line conductors can be made of a noble metal, such as silver or the like.

Figure 4A:
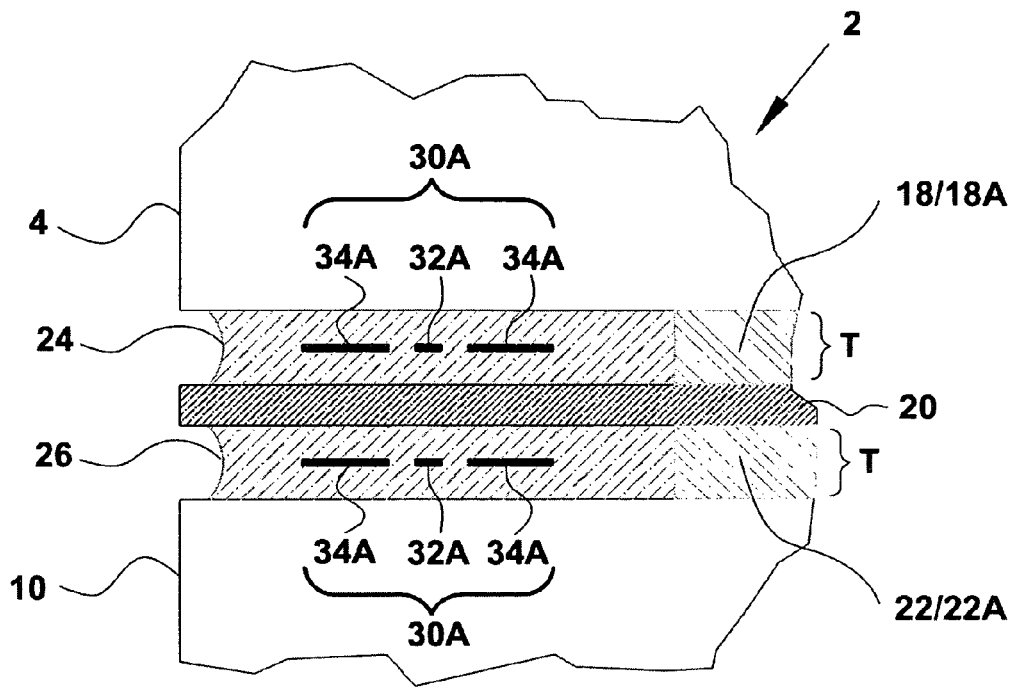
FIG. 4A is an enlarged fragmentary side view showing an exemplary seal construction for the fuel cell of FIG. 1 wherein two seals are each embedded with a transmission line having a coplanar waveguide design.
Figure 4B:
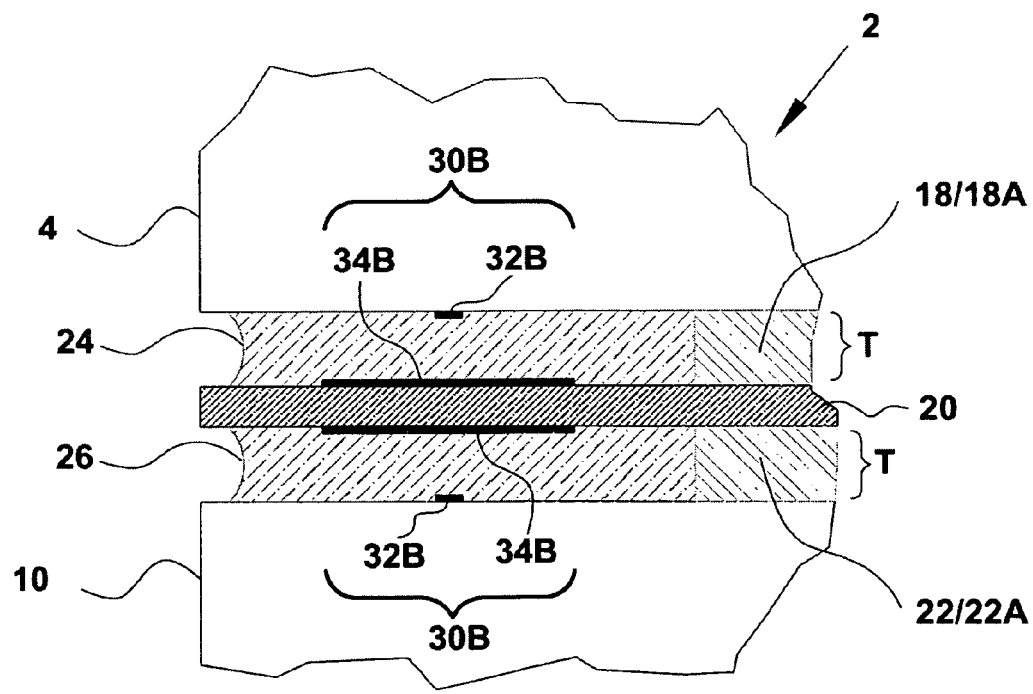
FIG. 4B is an enlarged fragmentary side view showing another exemplary seal construction for the fuel cell of FIG. 1 wherein two seals are each embedded with a transmission line having a microstrip design.
Figure 4C:
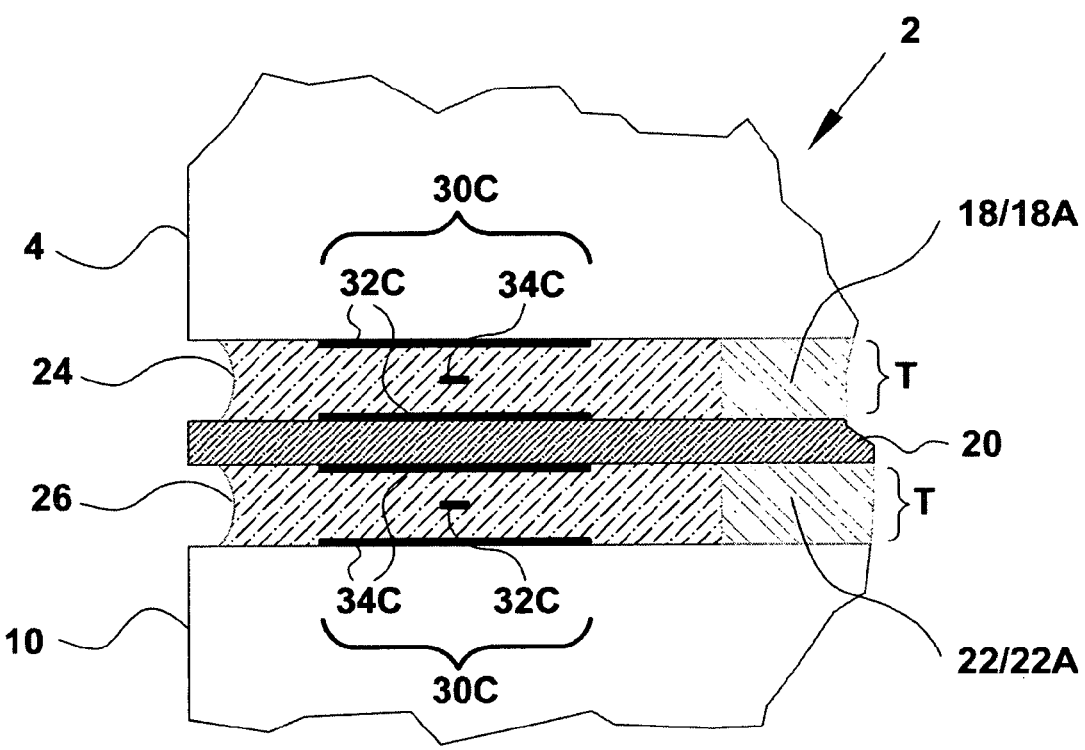
FIG. 4C is an enlarged fragmentary side view showing another exemplary seal construction for the fuel cell of FIG. 1 in which two seals are each embedded with a transmission line having a stripline design.

Turning now to FIGS. 4A, 4B and 4C, FIG. 4A illustrates how each of the seals 24 and 26 can be constructed with an embedded transmission line 30A that has a conventional coplanar waveguide design. According to this known transmission line geometry, each transmission line 30A includes a central signal conductor 32A and a pair of ground reference conductors 34A, all of which are situated in substantial coplanar relationship within the seal dielectric material. Preferably, the plane occupied by the conductors 32A and 34A is situated approximately half way between the opposing sides of the seal thin film thickness dimension "T." This constitutes the top and bottom of each seal 24 and 26 in FIG. 4A. It will be further seen in FIG. 4A that the seal dielectric material fills the remainder of the seal volume, including the gaps between each conductor.

In FIG. 4B, the seals 24 and 26 are each embedded with a transmission line 30B having a conventional microstrip design. According to this known transmission line geometry, each transmission line 30B includes a signal conductor 32B situated on one side of the seal thin film thickness dimension "T," and a ground reference conductor 34B situated on an opposing side of the thickness dimension "T." This constitutes the top and bottom of each seal 24 and 26 in FIG. 4B. Note that that the relative position of the conductors 32B and 34B could be reversed without affecting transmission line operation. Moreover, although the transmission lines 30B of each seal 24 and 26 are oriented so as to be mirror images of each other, this is an arbitrary representation and it will be appreciated that both transmission lines could be oriented in the same direction, if desired. It will be further seen in FIG. 4B that the seal dielectric material fills the remainder of the seal volume, including the gaps between each conductor.

In FIG. 4C, the seals 24 and 26 are embedded with a transmission line 30C having a conventional stripline design. According to this known transmission line geometry, each transmission line 30C includes a signal conductor 32C situated approximately midway between the opposing sides of seal thin film thickness dimension "T," and a pair of ground reference conductors 34C respectively situated at the opposing sides themselves. This constitutes the top and bottom of each seal 24 and 26 in FIG. 4B. It will be seen in FIG. 4C that the seal dielectric material fills the remainder of the seal volume, including the gaps between each conductor.

Figure 5A:
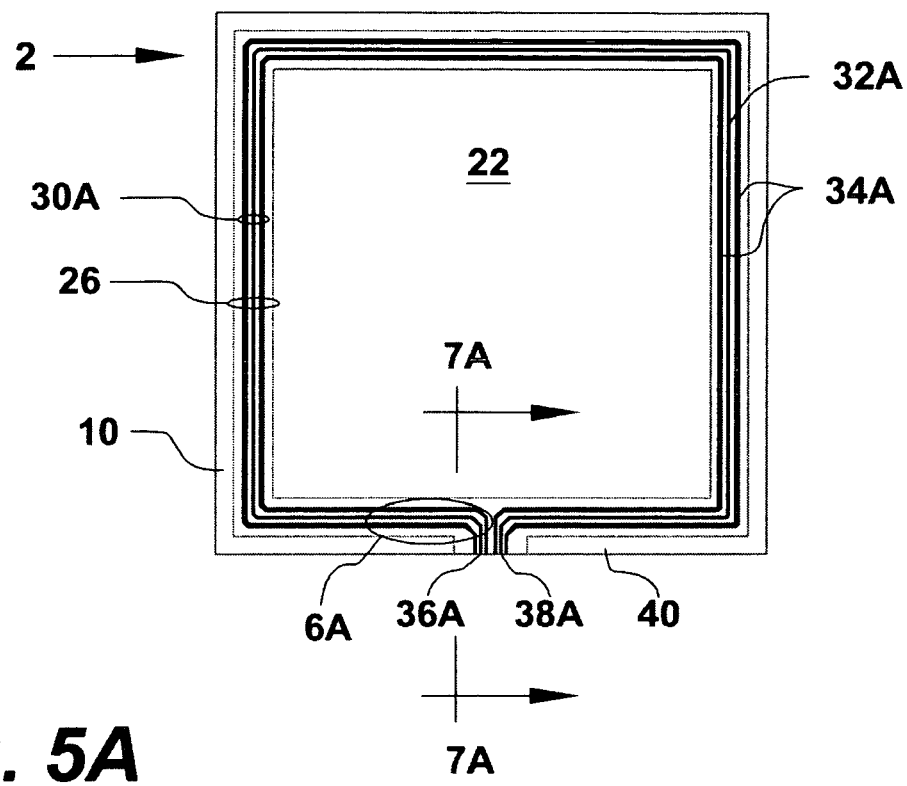
FIG. 5A is a cross-sectional view taken along line 5-5 in FIG. 3 showing a seal with the exemplary coplanar waveguide transmission line.
Figure 5B:
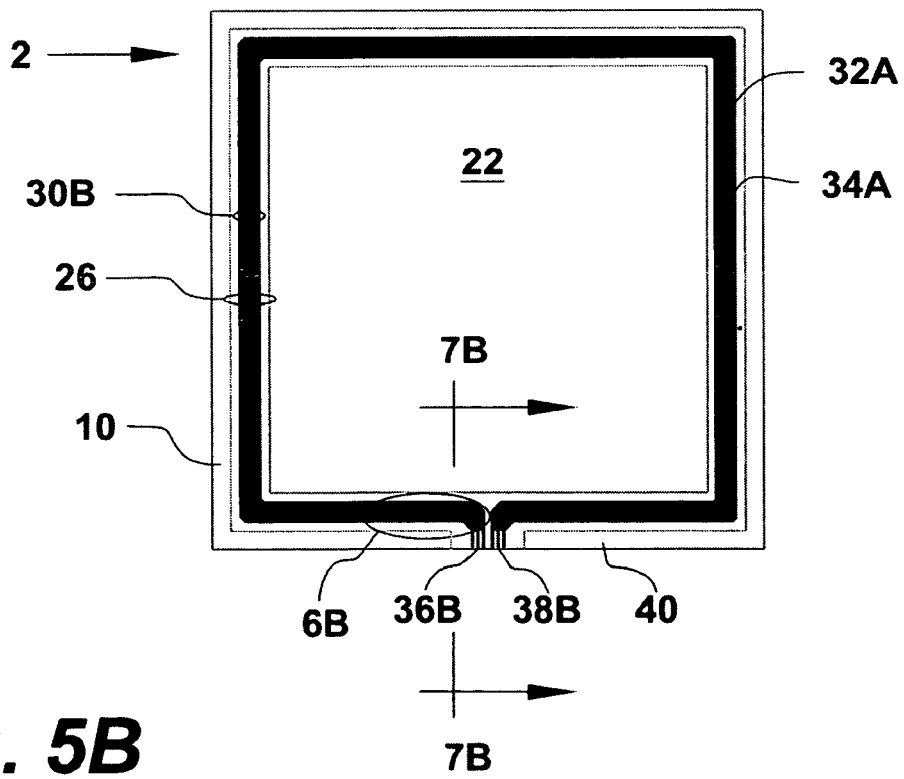
FIG. 5B is a cross-sectional view taken along line 5-5 in FIG. 3 showing a seal with the exemplary microstrip transmission line.
Figure 5C:
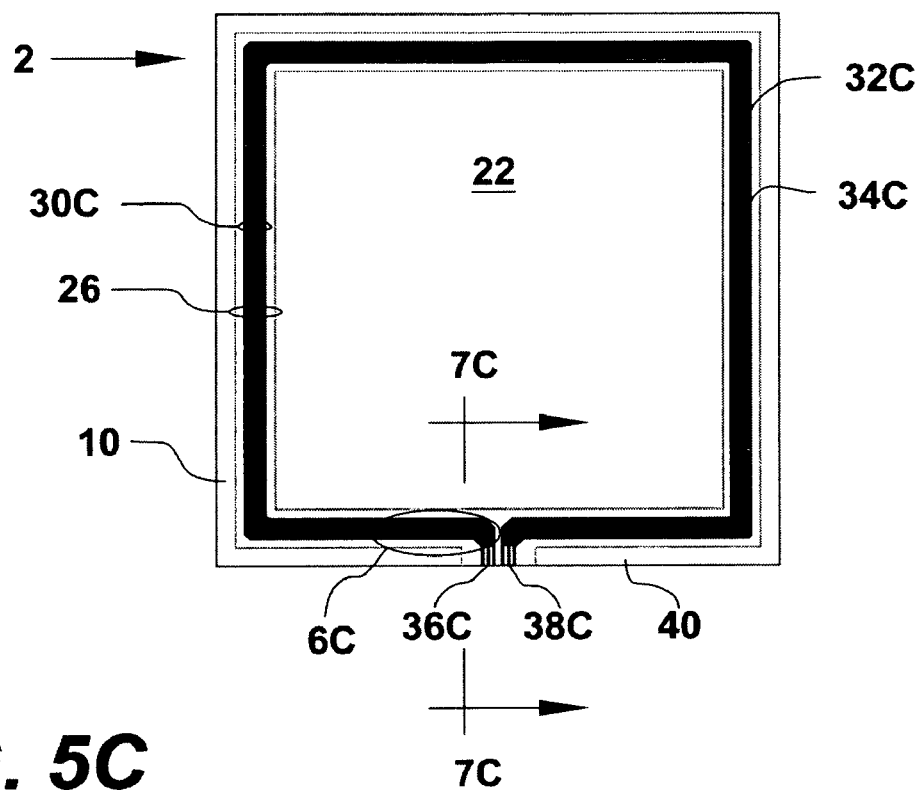
FIG. 5C is a cross-sectional view taken along line 5-5 in FIG. 3 showing a seal with the exemplary stripline transmission line.

Turning now to FIGS. 5A, 5B and 5C, the three alternative transmission line designs of FIGS. 4A, 4B and 4C are shown in plan view orientation according to section line 5-5 in FIG. 3. FIG. 5A illustrates the coplanar waveguide transmission line 30A, including its signal conductor 32A and the two ground plane conductors 34A. The transmission line 30A is shown as extending continuously between a pair of ports 36A and 38A, one of which can be used as a signal injection portion and both of which can be used as a signal sampling port. For convenience, each port 36A and 38A is formed on a ledge portion 40 of the adjacent plate. In FIG. 5A (which illustrates the seal 26), this is the plate 10. Although not shown, for the seal 24, the signal injection and sampling ports would be formed on a corresponding ledge portion of the plate 4. Each port 36A and 38A includes three terminals, one electrically connected to the signal conductor 32A, and the others electrically connected to the two ground reference conductors 34A. In an alternative construction, a single terminal could be electrically connected to both of the ground plane conductors 34A, such that the each port 36A and 38A would have only two terminals.

FIG. 5B illustrates the arrangement of the microstrip transmission line 30B, including its signal conductor 32B and the single ground plane conductor 34B. The transmission line 30B is shown as extending continuously between a pair of ports 36B and 38B, one of which can be used as a signal injection-portion and both of which can be used as a signal sampling port. For convenience, each port 36A and 38A is formed on the ledge portion 40 of the adjacent plate. In FIG. 5B (which illustrates the seal 26), this is the plate 10. Although not shown, for the seal 24, the signal injection and sampling ports would be formed on a corresponding ledge portion of the plate 4. Each port 36B and 38B includes three terminals, one electrically connected to the signal conductor 32B, and the others electrically connected to different portions of the ground reference conductor 34B. In an alternative construction, a single terminal could be electrically connected to both portions of the ground plane conductors 34B, such that the each port 36B and 38B would have only two terminals.

FIG. 5C illustrates the arrangement of the stripline transmission line 30C, including its signal conductor 32C and the two ground plane conductor 34C. The transmission line 30C is shown as extending continuously between a pair of ports 36C and 38C, one of which can be used as a signal injection portion and both of which can be used as a signal sampling port. For convenience, each port 36C and 38C is formed on the ledge portion 40 of the adjacent plate. In FIG. 5C (which illustrate the seal 26), this is the plate 10. Although not shown, for the seal 24, the signal injection and sampling ports would be formed on a corresponding ledge portion of the plate 4. Each port 36C and 38C includes three terminals, one electrically connected to the signal conductor 32C, and the others electrically connected to the two ground plane conductors 34C. In an alternative construction, a single terminal could be electrically connected to both of the ground plane conductors 34C, such that the each port 36C and 38C would have only two terminals.

Figure 6A:
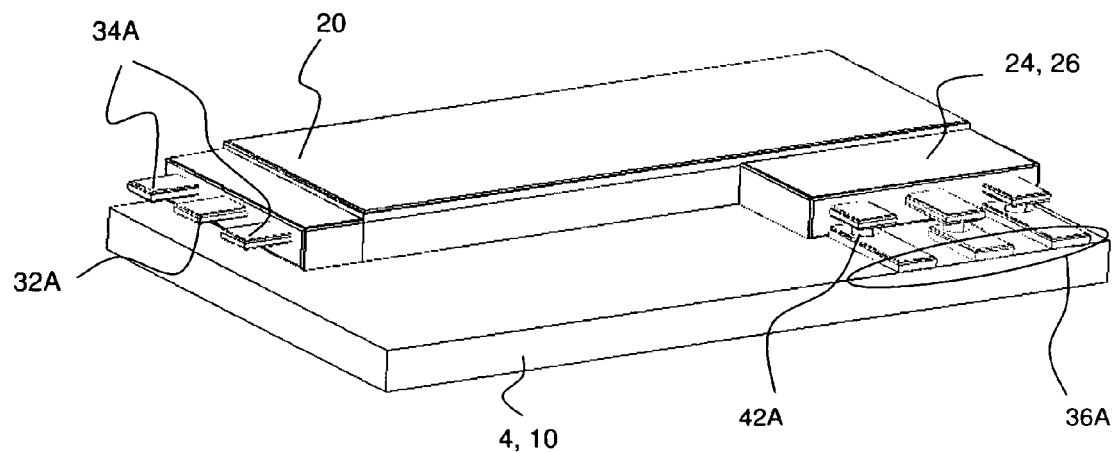
FIG. 6A is an enlarged fragmentary perspective view showing a portion of the transmission line of FIG. 5A in the area shown by inset 6A, including a port for signal injection or sampling.
Figure 6B:
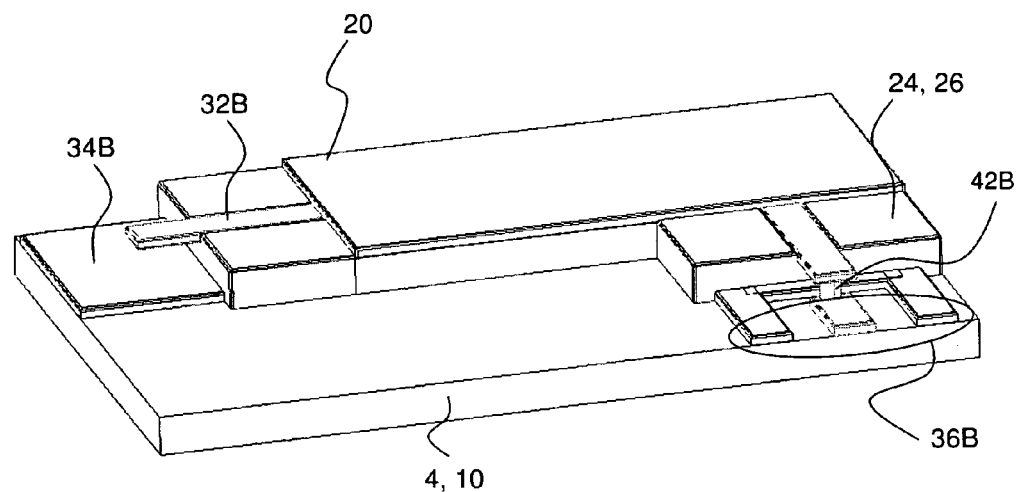
FIG. 6B is an enlarged fragmentary perspective view showing a portion of the transmission line of FIG. 5B in the area shown by inset 6B, including a port for signal injection or sampling.
Figure 6C:
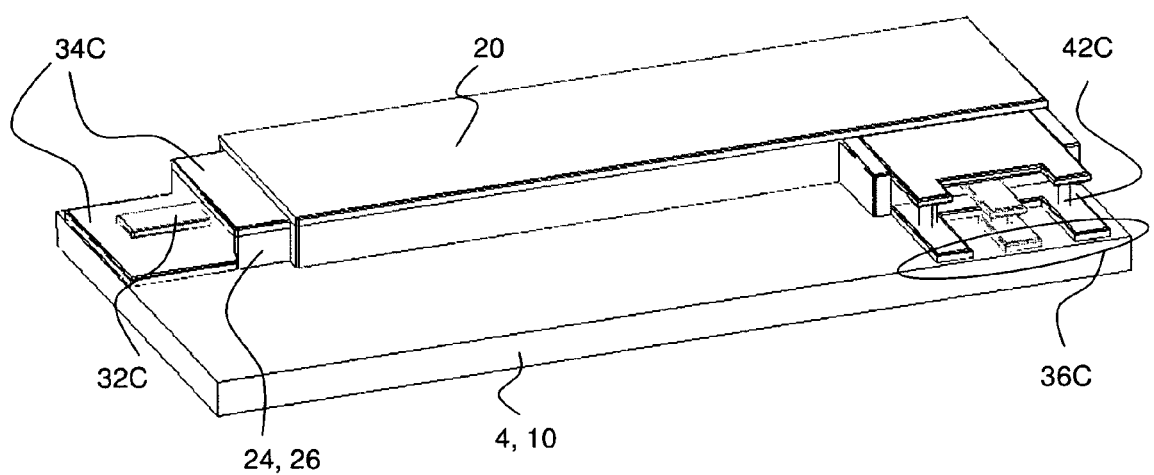
FIG. 6C is an enlarged fragmentary perspective view showing a portion of the transmission line of FIG. 5C in the area shown by inset 6C, including a port for signal injection or sampling.

Turning now to FIGS. 6A, 6B and 6C, details of the transmission lines 30A, 30B and 30C in the vicinity of their ports 36A/36B/36C are respectively shown. Although not shown, it may be assumed that the ports 38A/38B/38C are similarly constructed. In FIG. 6A, the waveguide signal conductor 32A and both ground reference conductors 34A are brought to the level of the plate ledge portion 40 by way of vias 42A formed at one end of the transmission line 30A. In FIG. 6B, an alternative conductor placement from that of FIG. 4B is shown in which the signal conductor 32B is adjacent to the electrolyte 20 and the ground reference conductor 34B is adjacent to one of the plates 4 or 10. The signal conductor 32B is brought to the level of the plate ledge portion 40 by way of a via 42B formed at the one end of the transmission line 30B. No via is required for the ground reference conductor 34B insofar as it is already at the level of the ledge portion 40. Instead, the ground reference conductor 34B may be split to form two terminals of the port 36B. In FIG. 6C, the signal conductor 32C and one of the ground reference conductors 34C are brought to the level of the plate ledge portion 40 by way of vias 42C formed at one end of the transmission line 30C. No via is required for the second ground reference conductor 34C insofar as it is already at the level of the ledge portion 40.

Figure 7A:
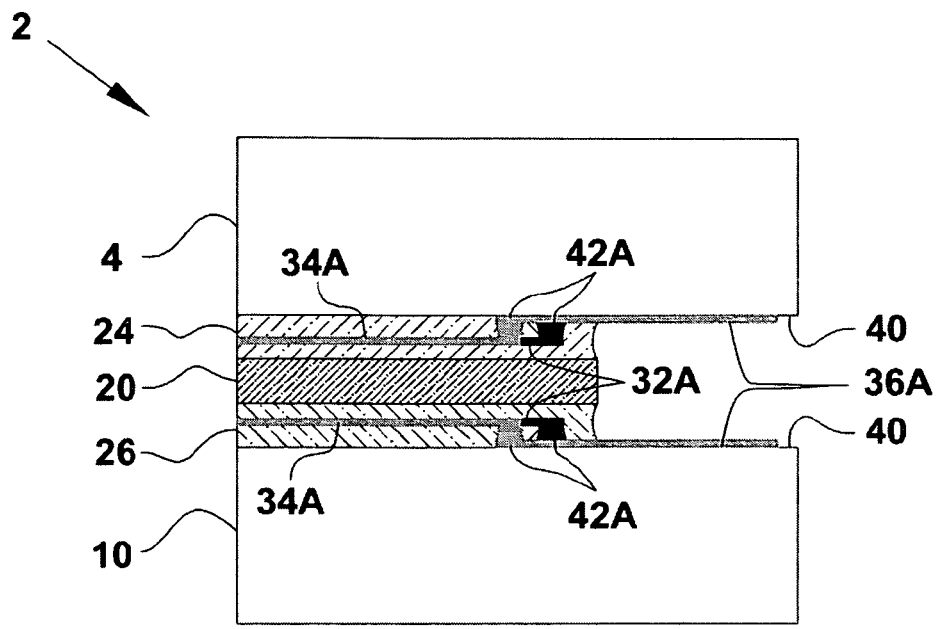
FIG. 7A is a cross-sectional view taken in the direction of line 7A-7A in FIG. 5A showing ports for signal injection or sampling extending respectively from both seals of the fuel cell of FIG. 1 when said seals have the exemplary coplanar waveguide transmission line.
Figure 7B:
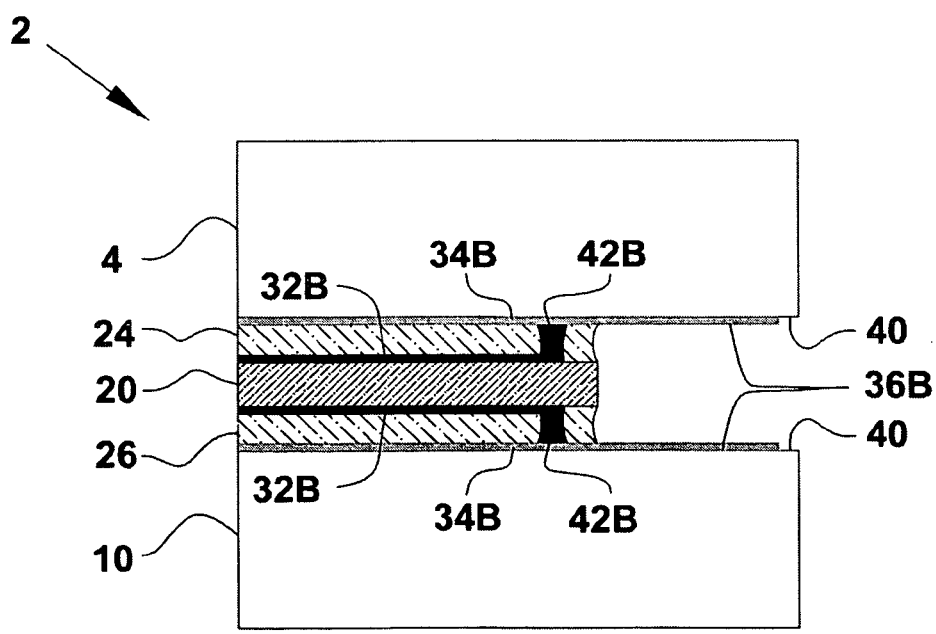
FIG. 7B is a cross-sectional view taken in the direction of line 7B-7B in FIG. 5B showing ports for signal injection or sampling extending respectively from both seals of the fuel cell of FIG. 1 when said seals have the exemplary microstrip transmission line.
Figure 7C:
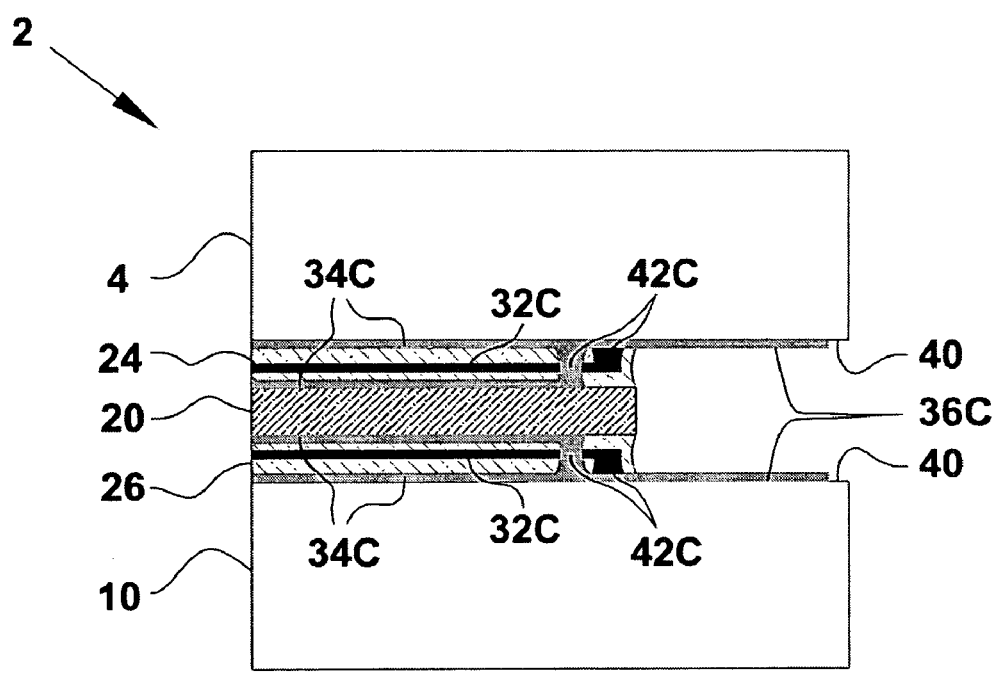
FIG. 7C is a cross-sectional view taken in the direction of 7C-7C in FIG. 5C showing ports for signal injection or sampling extending respectively from both seals of the fuel cell of FIG. 1 when said seals have the exemplary stripline transmission line.

Turning now to FIGS. 7A, 7B and 7C, a cross-sectional side view of one of the ports 36A, 36B and 36C associated with both of the seals 24 and 26 of the fuel cell 2 are shown. Although not illustrated in FIGS. 7A, 7B and 7C, a corresponding cross-sectional view of the ports 38A, 38B and 38C would have the same configuration.

Figure 8A:
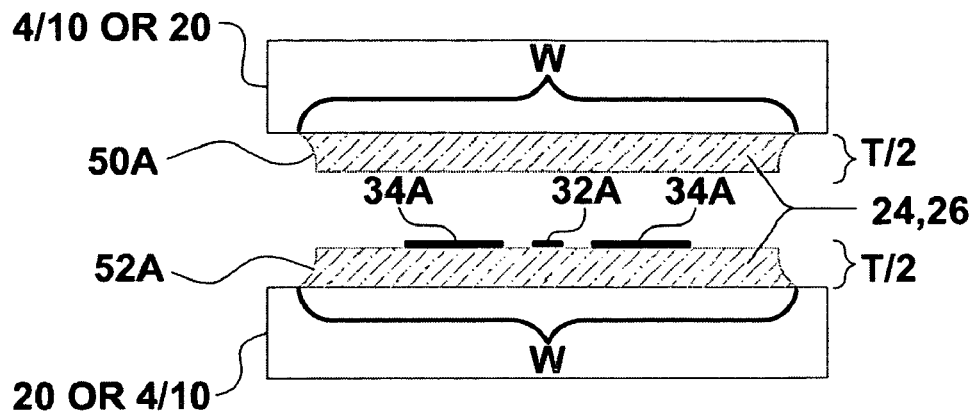
FIG. 8A is a side elevational view showing fabrication of a seal with the exemplary coplanar waveguide transmission line.
Figure 8B:
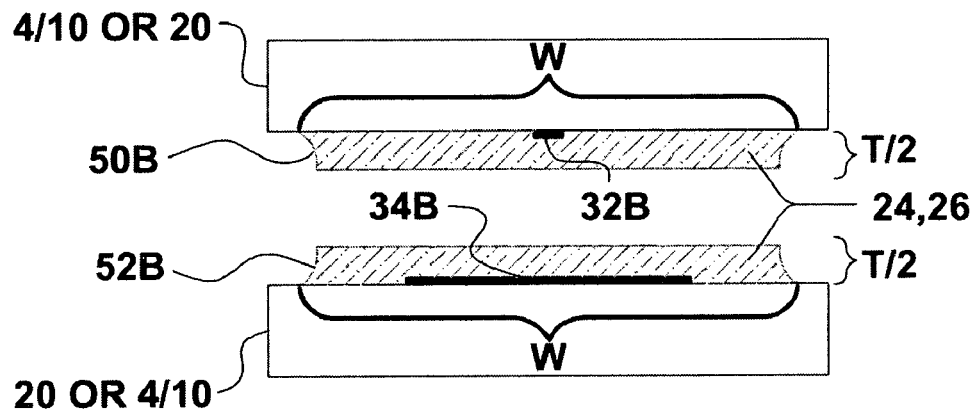
FIG. 8B is a side elevational view showing fabrication of a seal with the exemplary microstrip transmission line.
Figure 8C:
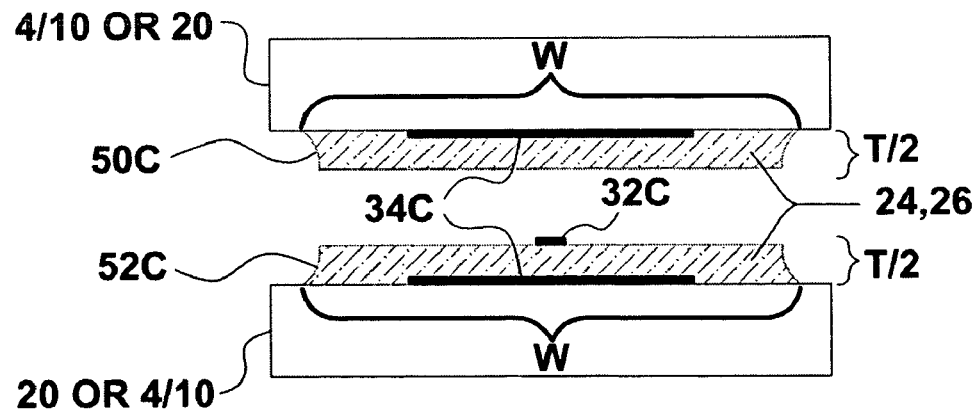
FIG. 8C is a side elevational view showing fabrication of a seal with the exemplary stripline transmission line.

Turning now to FIGS. 8A, 8B and 8C, exemplary fabrication techniques are shown that may be used to construct the seals 24 and 26 while embedding the transmission lines 30A, 30B and 30C therein. In each case, the exemplary approach is to use thin film processes to create the seal and transmission line structures. Each seal 24 and 26 is fabricated in two stages by depositing material onto the adjacent surfaces that the seals are to bond, thereby forming two seal subassemblies, and then joining the subassemblies together to form an integrated whole. In the case of the fuel cell 2, the adjacent surfaces to be bonded by each seal 24 and 26 comprise one of the plates 4 and 10, and an opposing side of the electrolyte 20.

Assuming the seals 24 and 26 comprise glass, the seal material can be deposited using a conventional frit sealing technique wherein a quantity of glass frit mixed with a conventional liquid vehicle provides a glass ink that is applied by way of dipping, spraying, painting, extrusion or screen printing. If the seal subassembly comprises transmission line conductors, these can also be applied using a suitable thin-film deposition technique. For example, assuming the transmission lines 30A, 30B and 30C are metallic, the metal combined in powder form with a conventional liquid vehicle provides a conductor ink that can be applied by way of dipping, spraying, painting, extrusion or screen printing. Following deposition, the glass and conductor slurries are dried to release volatiles by heating to relatively low temperature. The dried seal subassemblies are then placed in interfacial contacting relationship and heated at relatively high temperature to fuse the subassemblies form a composite seal.

In exemplary experimental seal constructions according to the invention, a thick film dielectric ink composition, QM44, and a thick film silver conductor ink composition, QM14, were both procured from DuPont Electronic Technologies, Research Triangle Park, NC. For each seal 24/26 to be created, the dielectric and conductor ink compositions were selectively applied by conventional screen printing using mesh sizes ranging from 280 to 400 to create two seal subassemblies. The subassembly thick film inks were dried following deposition by processing through an infrared dryer set at 100° C. Total process time was 10 minutes. The subassemblies were then positioned for final assembly and heated to 850° C. for 10 minutes to fuse the glass seal material.

FIG. 8A shows how the seals 24 and 26 can be formed with the coplanar waveguide transmission line 30A embedded therein. A first seal subassembly 50A comprises a glass thick film ink layer deposited on one of the plates 4 or 10 (or on the electrolyte 20). The deposition of the glass thick film ink layer is controlled to define a seal width dimension "W" and to establish a layer thickness of "T/2" that represents one-half of the final seal thickness "T." A second seal subassembly 52A comprises a glass thick film ink layer deposited in the same manner (i.e., identical in size and shape) on the electrolyte 20 (or on one of the plates 4 or 10), and further comprises a conductor thick film ink layer deposited on top of the glass thick film ink layer to define the signal conductor 32A and the ground reference conductors 34A. In an exemplary experimental seal construction comprising the transmission line 30A, the width dimension "W" of each seal subassembly 50A and 50B was 0.123 inches and the thickness dimension T/2 was 0.0015 inches. The transmission line conductors 32A and 34A were deposited to a thickness of 0.0005 inches. The width of the signal conductor 32A was 0.008 inches and the width of each ground reference conductor 34A was 0.030 inches. The spacing between the conductor 32A and ground conductor 34A was 0.008 inches. As described in more detail below, the foregoing dimensions as well as other properties of the seals 24/26 are governed by the desired electrical properties of the transmission line 30A.

FIG. 7B shows how the seals 24 and 26 can be formed with the microstrip transmission line 30B embedded therein. A first seal subassembly 50B comprises a conductor thick film ink layer deposited on one of the plates 4 or 10 (or on the electrolyte 20) to define the signal conductor 32B, and also comprises a glass thick film ink layer deposited over the conductor layer. The deposition of the glass thick film ink layer is controlled to define a seal width dimension "W" and to establish a layer thickness of "T/2" that represents one-half of the final seal thickness "T." A second seal subassembly 52B comprises a conductor thick film ink layer deposited on the electrolyte 20 (or on one of the plates 4 or 10) to define the ground reference conductor 34B, and also comprises a glass thick film ink layer deposited in the same manner as the glass thick film ink layer of the first seal subassembly 50B (i.e., identical in size and shape) over the conductor deposition. In an exemplary experimental seal construction comprising the transmission line 30B, the width dimension "W" of each seal subassembly 50B and 52B was 0.123 inches and the thickness dimension T/2 was 0.0038 inches. The transmission line conductors 32B and 34B were deposited to a thickness of 0.0005 inches. The width of the signal conductor 32B was 0.008 inches and the width of the ground reference conductor 34B was 0.080 inches. As described in more detail below, the foregoing dimensions as well as other properties of the seals 24/26 are governed by the desired electrical properties of the transmission line 30B.

FIG. 7C shows how the seals 24 and 26 can be formed with the stripline transmission line 30C embedded therein. A first seal subassembly 50C comprises a conductor thick film ink layer deposited on one of the plates 4 or 10 (or on the electrolyte 20) to define one of the ground reference conductors 34C, and also comprises a glass thick film ink layer deposited over the conductor layer. The deposition of the glass thick film ink layer is controlled to define a seal width dimension "W" and to establish a thick film ink thickness of "T/2" that represents one-half of the final seal thickness "T." A second seal subassembly 52C comprises a conductor thick film ink layer deposited on the electrolyte 20 (or on one of the plates 4 or 10) to define the second ground reference conductor 34C, and also comprises a glass thick film ink layer deposited in the same manner as the glass thick film ink layer of first seal subassembly 50C (i.e., identical in size and shape) over the conductor deposition. The second seal subassembly further comprises a second conductor thick film ink deposited on the glass thick film ink layer to define the signal conductor 32C. Although an experimental seal construction comprising the transmission line 30C was not constructed, the width dimension "W" of each seal subassembly 50C and 52C could be 0.123 inches and the thickness dimension T/2 could be 0.0038 inches. The transmission line conductors 32C and 34C can be deposited to a thickness of 0.0005 inches. The width of the signal conductor 32C could be 0.008 inches and the width of each ground reference conductor 34C could be 0.080 inches. As described in more detail below, the foregoing dimensions as well as other properties of the seals 24/26 are governed by the desired electrical properties of the transmission line 30C.

Figure 9:
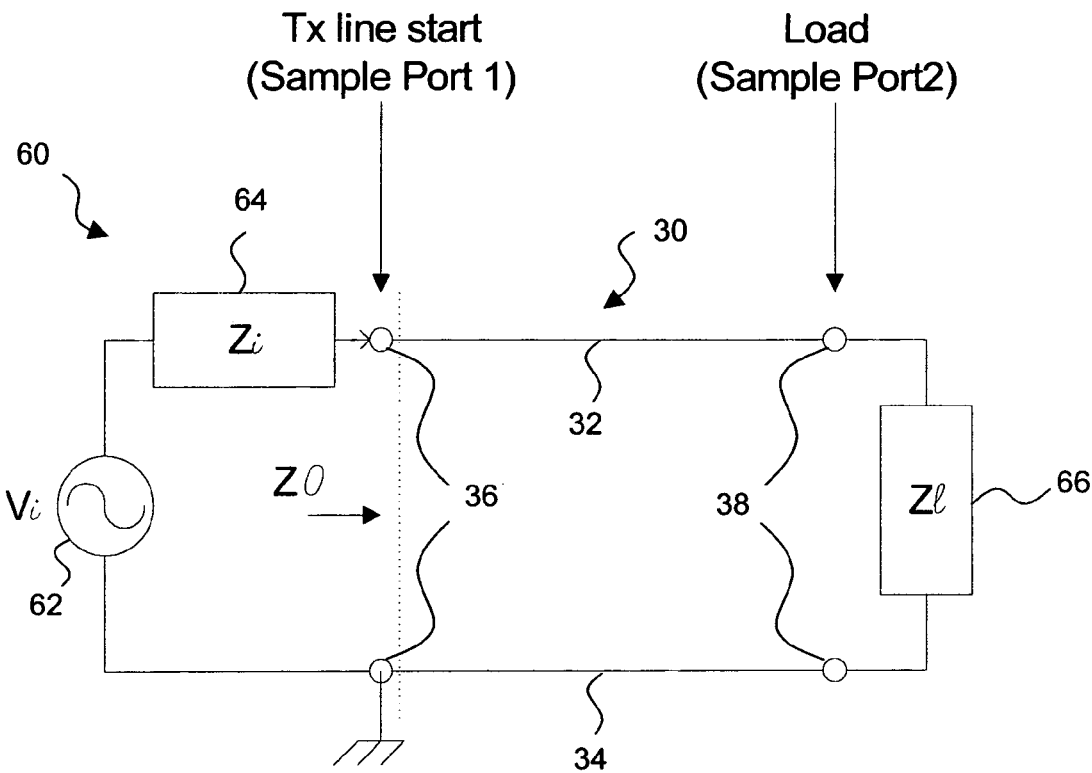
FIG. 9 is a schematic diagram showing the electrical characteristics of a seal transmission line according to the invention connected for time domain reflectometry analysis.
Figure 10:
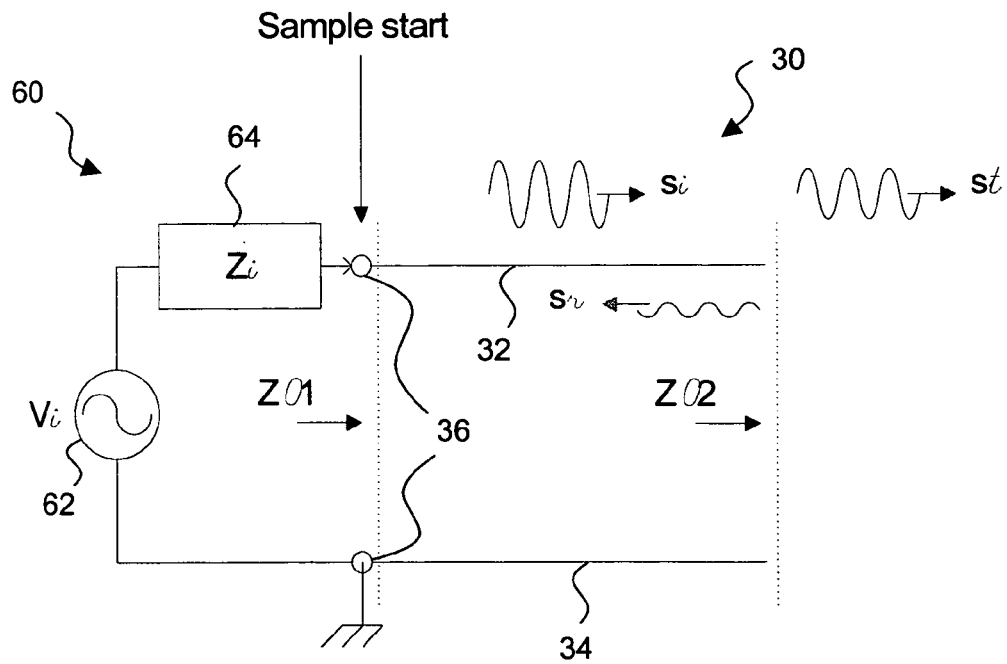
FIG. 10 is a schematic diagram according to FIG. 9 showing waveforms of interest to time domain reflectometry analysis.

FIGS. 9 and 10 illustrate an arrangement for connecting any one of the transmission lines 30A, 30B and 30C (shown generically by reference numeral 30) in a closed loop circuit 60 for signal injection and monitoring using time domain reflectometry. The circuit 60 includes a transmission line signal conductor 32 (corresponding to any of the conductors 32A, 32B or 32C), a ground reference conductor 34 (corresponding to any of the conductors 34A, 34B or 34C), a signal injection port 36 (corresponding to any of the ports 36A, 36B or 36C) and a sample port 38 (corresponding to any of the ports 38A, 38B or 38C). The signal injection port 36 is connected to a variable voltage source 62 capable of generating rapid rise time step pulses. The voltage source 62 can be provided by a conventional TDR (time domain reflectometry) test instrument that has an output jack for connection to the signal injection port 36 and additionally includes a digital sampling oscilloscope (not shown) for generating a waveform image corresponding to the signals propagating through the transmission line 30. As shown by reference numeral 64, the voltage source 62 has an internal impedance value of Zi. For a conventional TDR test instrument, the internal impedance Zi is typically 50 ohms. According to conventional transmission line theory, the transmission line 30 can be represented as a network of passive components consisting of resistors, capacitors and inductors that collectively have a characteristic (infinite length) impedance Z0 as seen at the signal injection port 36. The value of Z0 is preferably matched to the internal impedance Zi of the voltage source 62 (e.g., 50 ohms). As shown in FIG. 9, a load 66 with impedance Zl is placed across the terminals of the sample port 38. Most conventional TDR test instruments are adapted to provide a variable impedance load, and the sample port 38 can be connected to an associated load jack on the TDR test instrument that is provided for this purpose. For time domain reflectometry, the value of Zl is typically different than the characteristic impedance Z0 of the transmission line under test in order to facilitate signal reflection from the end of the transmission line back to the TDR test instrument for use as a reference.

The characteristic impedance Z0 of a generic transmission line is given by the equation $Z0=(L/C)^{1/2}$, where L and C are the equivalent circuit inductance and capacitance of any given transmission line section (and ignoring internal line resistance and conductance parameters). A desired characteristic impedance of the transmission line 30 can thus be engineered by adjusting, as necessary, any physical characteristics that will affect the inductance and capacitance values along the length of the line. These characteristics include the geometry of the conductors 32 and 34 (e.g., conductor size, shape and spacing) and the dielectric constant of the seal material. In addition, areas such as 90° bends within the transmission line 30 may need to be relieved or otherwise adjusted in order to control the impedance in these sections.

With particular reference now to FIG. 10, time domain reflectometry involves the injection of pulsatile signals with very fast rise time (e.g., Pico seconds) into a transmission line, and then "listening" to the reflected return pulses in a manner that is somewhat analogous to a radar or sonar system. One signal of interest is the incident signal Si that is input to the transmission line. A second signal of interest is the signal Si after it has been transmitted through the transmission line as a signal St. A third signal of interest is the reflected signal Sr received from various points along the transmission line due to differences in characteristic impedance or line discontinuities caused by factors such as (1) a change in dimension between the signal and ground reference conductors, (2) a change in dimension between the ground reference conductors themselves (if there are more than one), (3) a break in the signal or ground reference conductors, and (4) a change in seal dielectric constant. FIG. 10 shows a characteristic impedance Z02 at an arbitrary point P1 on the transmission line 30 producing the signal reflection Sr as a result of Z02 being different than the characteristic impedance Z01 at the signal injection port 36.

Figure 11A:
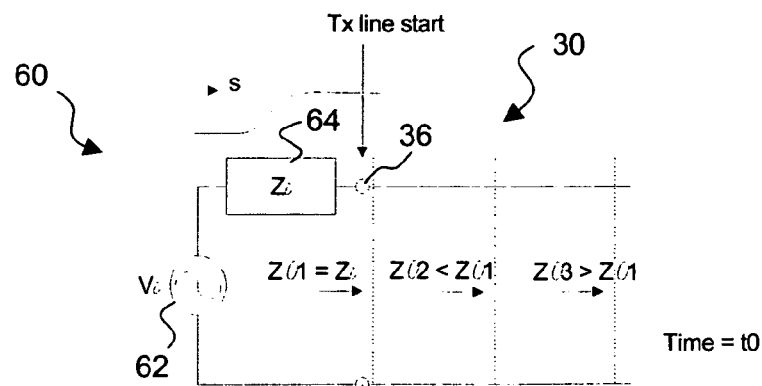
FIGS. 11A, 11B and 11C are schematic diagrams according to FIG. 10 showing incident and reflected waveforms measured at three different times during time domain reflectometry analysis.
Figure 11B:
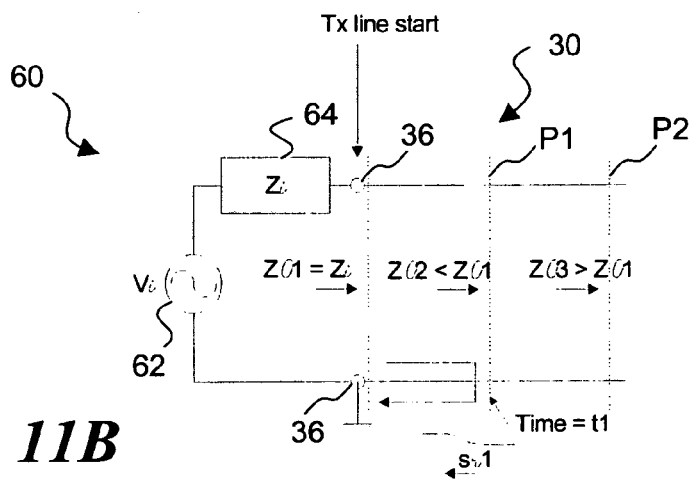
Figure 11C:
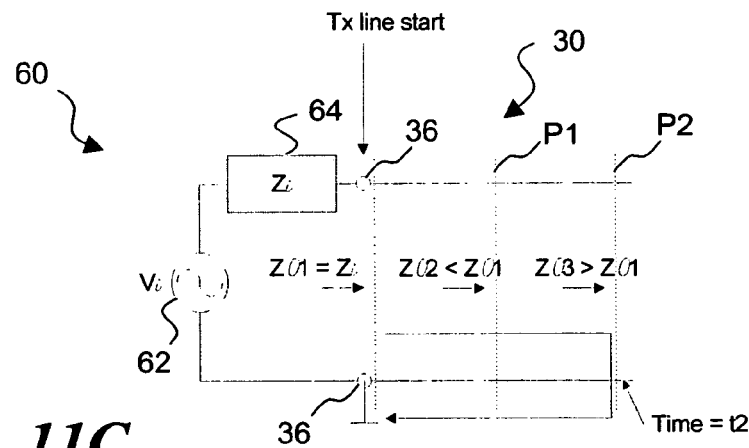

FIGS. 11A, 11B and 11C show the circuit 60 of FIGS. 9 and 10 at three different times t0, t1 and t2. The time t0 is the time at which an incident signal Si is first placed on the transmission line 30. The time t1 is the time it takes for the incident signal to propagate to a point P1 on the transmission line 30 having a characteristic impedance of Z02 that differs from the characteristic impedance Z01 at the signal injection port 36 (Zi). The time t2 is the time it takes for the incident signal Si to propagate to a point P2 on the transmission line 30 having a characteristic impedance of Z03 that differs from the characteristic impedance Z01 at the signal injection port 36 (Zi) and also differs from Z02. The upper left hand portion of FIG. 11A shows an exemplary waveform associated with the incident signal Si at the signal injection port 36. The rise portion of the waveform represents the input pulse. The lower central portion of FIG. 11B shows an exemplary waveform associated with a reflected signal Sr1 generated at point P1 and traveling toward the signal injection port 36 as a result of the characteristic impedance Z02 being different from the characteristic impedance Z01. It will be seen that the reflected signal Sr1 exhibits a decrease in voltage relative to the incident signal Si. This is consistent with the characteristic impedance Z02 being less than the characteristic impedance Z01 (i.e., tending toward a short circuit condition) according to conventional transmission line theory. The lower right hand portion of FIG. 11C shows an exemplary waveform associated with a reflected signal Sr2 generated at point P2 and traveling toward the signal injection port 36 as a result of the characteristic impedance Z02 being different from the characteristic impedance Z01. It will be seen that the reflected signal Sr2 exhibits an increase in voltage relative to the incident signal Si. This is consistent with the characteristic impedance Z02 being greater than the characteristic impedance Z01 (i.e., tending toward an open circuit condition) according to conventional transmission line theory.

Figure 12:
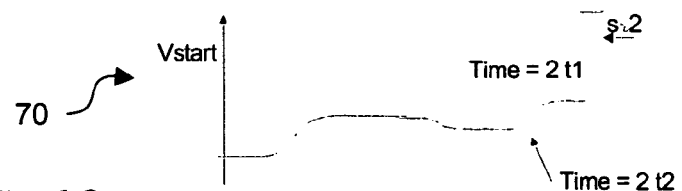
FIG. 12 is a voltage vs. time waveform graph superimposing the waveforms of FIGS. 11A, 11B and 11C during time domain reflectometry analysis.

FIG. 12 shows a graph 70 of voltage plotted against time in which the signals Si, Sr1 and Sr2 of FIGS. 11A, 11B and 11C are superimposed on each other to produce a typical time domain reflectometry waveform output. The waveform reflections occurring at points P1 and P2 (i.e., Sr1 and Sr2) are shown as occurring at times 2t1 and 2t2. These times represent the round trip delay associated with the incident signal Si having to propagate to the respective reflection points and the reflected signals Sr1 and Sr2 having to return back to the signal injection port 36.

Figure 13:
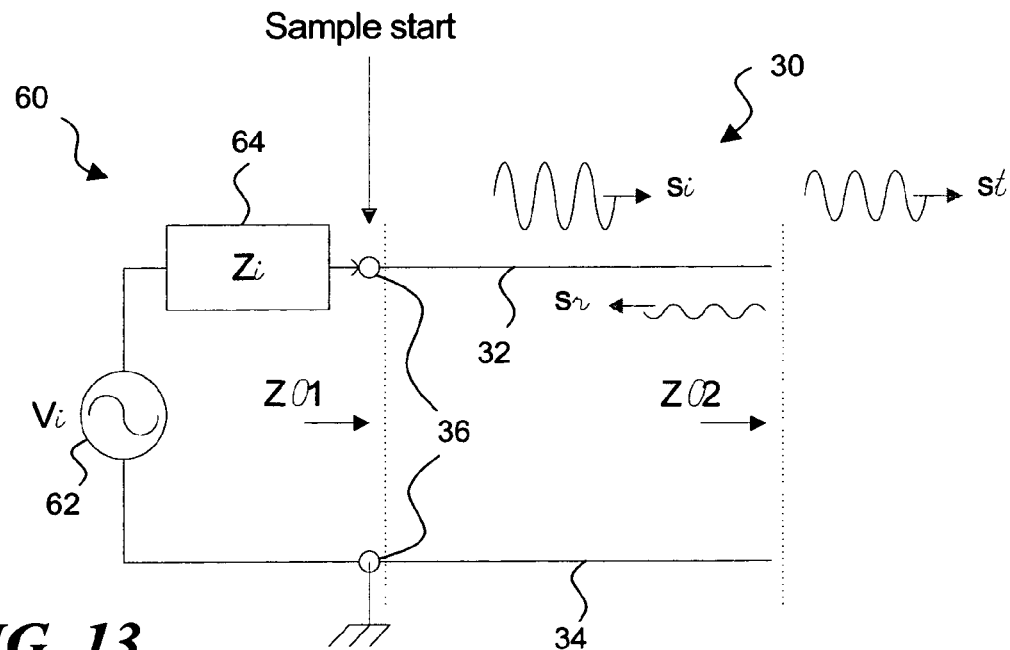
FIG. 13 is a schematic diagram showing the electrical characteristics of a seal transmission line according to the invention connected for frequency response analysis, together with waveforms of interest to frequency response analysis.
Figure 14:
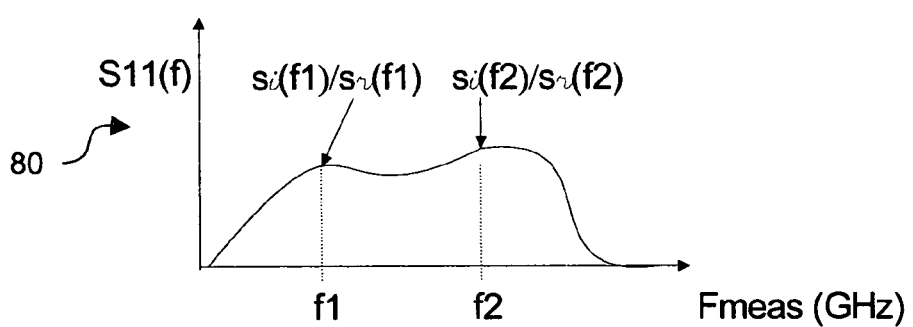
FIG. 14 is graph of signal ratio (incident signal/reflected signal) versus frequency during frequency response analysis.

Turning now to FIGS. 13 and 14, the use of frequency response analysis to evaluate any one of the transmission lines 30A, 30B and 30C is illustrated as an alternative to (or to complement) the use of time domain reflectometry. FIG. 13 shows the same closed loop circuit arrangement 60 shown in FIG. 10, the only difference being that the variable voltage source 62 (with its associated internal impedance 64) is provided by a conventional FR (frequency response) test instrument that has an output jack for connection to the signal injection port 36 and additionally includes a display (not shown) for generating a waveform image corresponding to the signals propagating through the transmission line 30. For a conventional FR test instrument, the internal impedance Zi is typically 50 ohms. The characteristic impedance Z0 of the transmission line 30 as seen at the signal injection port 36 should thus be matched to this value. For frequency response analysis, the output of voltage source 62 is a spectrum of sinusoids. When injected at the signal injection port 36, these sinusoids will propagate down the transmission line 30. The energy of the incident signal Si will be compared to the energy of reflected signals Sr reflected back from one or more points along the transmission line 30, and to the energy of the transmitted signal St received at the far end of the transmission line (which is connected to the FR instrument's load jack).

Changes in frequency response due to physical conditions along the transmission line 30 can thereby be monitored. This is shown by the graph 80 of FIG. 14, which plots the ratio of injected signal strength to reflected signal strength (Si/Sr), injected signal strength to passed signal strength (Si/Sp), and phase relationship between those same quantities all as a function of frequency. In FIG. 14, the changes in physical condition result in shape of the frequency response plot corresponding to the specific nature of the physical change but not its position along the transmission line. This is in contrast to the TDR approach that indicates the position of the physical change but not necessarily the specific nature of the change.

The graphs 70 and 80 of FIGS. 12 and 14 provide useful analytical tools for identifying anomalies in any dielectric seal. Advantageously, the analysis techniques described above can be implemented in real time during all phases of seal operation including the critical phase of initial startup from ambient to normal operating temperature, and the return to ambient temperature following device shutdown. Through pulsatile and frequency spectrum excitation of a set of known good seals, and by associating response signatures with specific defect formations, baseline data sets can be established for use in identifying deviations that may be indicative of seal problems. Applying such data, the identification of specific seal anomalies, their time of emergence, their location on the seal, and (potentially) the proximity to failure, can all be determined based on observed trends.

Accordingly, a system and method for monitoring dielectric seal integrity have been disclosed within the context of the several exemplary seal embodiments and analytical measurement techniques discussed above. It should of course be understood that the description and the drawings herein are merely illustrative, and it is contemplated that various modifications, combinations and changes can be made thereto without departing from the scope of the invention. As such, the invention is not to be in any way limited except in accordance with the spirit of the appended claims and their equivalents.

What is claimed is:

1. In a fuel cell having an anode, a cathode and an intermediate electrolyte, a method for in-situ integrity monitoring of a seal in said fuel cell, comprising:
   embedding an electrical transmission line within a seal made of glass or ceramic dielectric material and sealing an interface between adjacent structures;
   said interface comprising adjacent opposing surfaces to which said seal is bonded;
   exciting said transmission line with an excitation signal;
   sampling said transmission line to obtain signal samples resulting from said excitation signal; and
   analyzing of said signal samples for indications of seal integrity problems.

2. The method of claim 1, wherein said transmission line comprises a signal conductor and at least one ground reference conductor.

3. The method of claim 1, wherein said transmission line has a microstrip construction comprising a signal conductor proximate to a first side of said seal and a ground reference conductor proximate to a second side of said seal.

4. The method of claim 1, wherein said transmission line has a stripline construction comprising a signal conductor centrally disposed between first and second sides of said seal and a pair of ground reference conductors respectively disposed proximate to said first and second sides of said seal.

5. The method of claim 1, wherein said transmission line has a coplanar waveguide construction comprising a signal conductor and a pair of ground reference conductors respectively disposed on opposing sides of said signal conductor in substantial coplanar relationship therewith.

6. The method of claim 1, wherein said exciting, sampling and analyzing steps are implemented using time domain reflectometry by introducing a pulsatile excitation signal into said transmission line at a signal injection port, monitoring reflected samples of said excitation signal at selected times at a sample port that is the same as or proximate to said signal injection port, conelating said samples with different locations on said transmission line, evaluating said samples for changes in characteristic impedance of said transmission line due to changes in dielectric constant of said seal and/or disruption of said transmission line, and making determinations about the integrity of said seal based on said evaluations.

7. The method of claim 6, wherein said exciting, sampling and analyzing steps are additionally implemented using frequency response analysis by introducing a spectrum of sinusoidal excitation signals into said transmission line at a signal injection port, monitoring said excitation signal at a first sample port that is the same as or proximate to said signal injection port, monitoring said excitation signal at a second sample port that is remote from said first sample port, comparing signal energy and frequency response at said first and second sample ports to determine changes in said excitation signal resulting from dimensional changes in said transmission line due to seal temperature, and making determinations about the integrity of said seal based on said evaluations.

8. The method of claim 1, wherein said transmission line is embedded by forming a first signal conductor thereof and a first portion of said seal in association with a first one of said adjacent surfaces, forming a second signal conductor thereof and a second portion of said seal in association with a second one of said adjacent surfaces, placing said first and second seal portions in interfacial contacting relationship, and applying heat to fuse said first and second seal portions to each other.

9. The method of claim 1, wherein said transmission line is embedded by forming all signal conductors thereof and a first portion of said seal in association with a first one of said adjacent surfaces, forming a second portion of said seal in association with a second one of said adjacent surfaces, placing said first and second seal portions in interfacial contacting relationship, and applying heat to fuse said first and second seal portions to each other.

10. The method of claim 1, wherein said transmission line has a characteristic impedance of approximately 50 ohms.

11. In a fuel cell having an anode, a cathode and an intermediate electrolyte, a seal having in-situ integrity monitoring capability, comprising:
   a quantity of glass or ceramic dielectric material sealing an interface between adjacent structures;
   said interface comprising adjacent opposing surfaces to which said seal is bonded;
   an electrical transmission line embedded within said dielectric material;
   a signal injection port for exciting said transmission line with an excitation signal;
   at least one sample port for sampling said transmission line to obtain signal samples resulting from said excitation signal; and
   said sample port(s) being adapted for connection to a signal analyzer adapted to analyze said signal samples for indications of seal integrity problems.

12. The device of claim 11, wherein said signal injection port is situated at a first end of said transmission line and provides a first sample port, and wherein a second sample port is situated at a second end of said transmission line.

13. The device of claim 11, wherein said transmission line comprises a signal conductor and at least one ground reference conductor.

14. The device of claim 11, wherein said transmission line has a microstrip construction comprising a signal conductor proximate to a first side of said seal and a ground reference conductor proximate to a second side of said seal.

15. The device of claim 11, wherein said transmission line has a stripline construction comprising a signal conductor centrally disposed between first and second sides of said seal and a pair of ground reference conductors respectively disposed proximate to said first and second sides of said seal.

16. The device of claim 11, wherein said transmission line has a coplanar waveguide construction comprising a signal conductor and a pair of ground reference conductors respectively disposed on opposing sides of said signal conductor in substantial coplanar relationship therewith.

17. The device of claim 11, wherein said transmission line has a characteristic impedance of approximately 50 ohms.

18. The device of claim 11, wherein said seal material and said transmission line have closely matching thermal expansion properties.

19. The device of claim 11, wherein said seal comprises glass and said transmission line comprises silver.

20. In a fuel cell, a seal having in-situ integrity monitoring capability, comprising:
- a quantity of dielectric material sealing an interface between adjacent structures of said fuel cell;
- an electrical transmission line embedded within said dielectric material;
- a signal injection port for exciting said transmission line with an excitation signal;
- at least one sample port for sampling said transmission line to obtain signal samples resulting from said excitation signal; and
- said sample port(s) being adapted for connection to a signal analyzer adapted to analyze said signal samples for indications of seal integrity problems.

* * * * *